(12) United States Patent
Kim

(10) Patent No.: US 6,593,039 B1
(45) Date of Patent: Jul. 15, 2003

(54) PHOTORESIST MASK THAT COMBINES ATTENUATED AND ALTERNATING PHASE SHIFTING MASKS

(75) Inventor: Hung-Eil Kim, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 65 days.

(21) Appl. No.: 09/884,840

(22) Filed: Jun. 19, 2001

(51) Int. Cl.[7] .................................................. G03F 9/00

(52) U.S. Cl. ......................................................... 430/5

(58) Field of Search ............................. 430/5, 311, 322, 430/323, 324

(56) References Cited

U.S. PATENT DOCUMENTS

| | | | | |
|---|---|---|---|---|
| 5,882,827 A | * | 3/1999 | Nakao | 430/5 |
| 6,190,809 B1 | * | 2/2001 | Tzu et al. | 430/5 |
| 2002/0132173 A1 | * | 9/2002 | Rolfson | 430/5 |

* cited by examiner

*Primary Examiner*—S. Rosasco
(74) *Attorney, Agent, or Firm*—Foley & Lardner

(57) ABSTRACT

A photoresist mask used in the fabrication of integrated circuits, can include a first portion and a second portion. The first portion has a phase shifting material layer and an opaque layer deposed over a transparent layer. The first portion also has trenches in the transparent layer selectively located to provide an alternating phase shifting characteristic. The second portion has the opaque layer deposed over the phase shifting material layer which is deposed over the transparent layer.

20 Claims, 3 Drawing Sheets

PHOTORESIST MASK THAT COMBINES ATTENUATED AND ALTERNATING PHASE SHIFTING MASKS

FIELD OF THE INVENTION

The present specification relates generally to the field of integrated circuits and to methods of manufacturing integrated circuits. More particularly, the present specification relates to a photoresist mask that combines attenuated and alternating phase shifting masks.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for transferring patterns between various media. According to conventional projection lithography, a silicon slice, the wafer, is coated uniformly with a lithographic coating. The lithographic coating is a radiation-sensitive film or coating (e.g., the photoresist).

An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

The ability to reduce the size of structures, such as, shorter IC gate lengths depends, in part, on the wavelength of light used to expose the photoresist. In conventional fabrication processes, optical devices expose the photoresist using light having a wavelength of 248 nm (nanometers), but conventional processes have also used the 193 nm wavelength. Further, next generation lithographic technologies may progress toward a radiation having a wavelength of 157 nm and even shorter wavelengths, such as those used in EUV lithography (e.g., 13 nm).

Phase shifting mask technology has been used to improve the resolution and depth of focus of the photolithographic process. Phase shifting mask technology refers to the use of a photolithographic mask which selectively alters the phase of the light passing through certain areas or apertures of the mask to take advantage of destructive interference to improve resolution and depth of focus. The aperture can include a transparent substrate coated by an opaque material, such as, chrome. For example, in a simple case, each aperture in the phase shifting mask transmits light 180 degrees out of phase from light passing through adjacent apertures. This 180 degree phase difference causes any light overlapping from two adjacent apertures to interfere destructively, thereby reducing any exposure in the center.

An exemplary phase shifting mask 10 is illustrated in FIG. 1. Phase shifting mask 10 includes a transparent layer 12 and an opaque layer 14. Opaque layer 14 provides a printed circuit pattern to selectively block the transmission of light from transparent layer 12 to a layer of resist on a semiconductor wafer. Transparent layer 12 includes trenches 16 which are etched a predetermined depth into transparent layer 12. The light transmitted through transparent layer 12 at trenches 16 is phase-shifted 180 degrees from the transmission of light through other portions of phase shifting mask, such as portions 18. As the light travels between phase shifting mask 10 and the resist layer of a semiconductor wafer below (not shown), the light scattered from phase shifting mask 10 at trenches 16 interferes constructively with the light transmitted through phase shifting mask 10 at portions 18, to provide improved resolution and depth of focus.

As mentioned, various different wavelengths of light are used in different photolithographic processes. The optimal wavelength of light is based on many factors, such as the composition of the resist, the desired critical dimension (CD) of the integrated circuit, etc. Often, the optimal wavelength of light must be determined by performing a lithography test with photolithographic equipment having different wavelengths. When a phase shifting mask technique is utilized, two different phase shifting masks must be fabricated, each mask having trenches 16 suitable for phase shifting light of the desired wavelength. The fabrication of phase shifting masks is costly. Further, comparison of the effect of the two different wavelengths printing processes is difficult and requires complex software processing to provide a suitable display.

Thus, there is a need for an improved phase shifting mask and method of testing photolithographic equipment. Further, there is a need for reducing or eliminating the cost of fabricating multiple phase shifting masks for multiple wavelengths of light. Further still, there is a need for a photoresist mask that combines attenuated and alternating phase shifting masks.

SUMMARY OF THE INVENTION

An exemplary embodiment relates to a photoresist mask used in the fabrication of integrated circuits. This photoresist mask can include a first portion and a second portion. The first portion has a phase shifting material layer and an opaque layer deposed over a transparent layer, where the first portion has trenches in the transparent layer selectively located to provide an alternating phase shifting characteristic. The second portion has the opaque layer deposed over the phase shifting material layer which is deposed over the transparent layer.

Another exemplary embodiment relates to a photolithographic mask which selectively alters the phase of light passing through certain areas of the mask to improve feature resolution and depth of focus in the lithographic process. This mask can include a transparent layer, a first opaque layer deposed over the transparent layer, and a second opaque layer deposed over portions of the first opaque layer. A first portion of the photolithographic mask is defined by an area including apertures in the first and second opaque layers and trenches in the transparent layer beneath every other aperture in the first and second opaque layers. The first portion has an alternating phase shifting characteristic. A second portion of the photolithographic mask is defined by an area including at least one aperture in the first and second opaque layers. The second portion has an attenuating phase shifting characteristic.

Another exemplary embodiment relates to a test photolithographic mask having both alternating phase shifting and attenuating phase shifting portions. This test photolithographic mask can include a first section of a transparent layer and a first opaque layer, where the first section is configured to provide alternating phase shifting properties and a second section of the transparent layer, the first opaque layer and a second opaque layer, where the second section is configured to provide attenuating phase shifting properties.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

In integrated circuit lithography processes, phase shifting masks can be used to delay or shift the phase of light. This phase shifting can be accomplished by etching regions of quartz on a mask to a precise depth, depending on the wavelength of the light to be used to expose the wafer. Such phase shifting masks are sometimes referred to as alternating phase shifting masks because they use alternating adjacent apertures in the quartz. Another type of phase shifting mask is sometimes referred to as attenuating phase shifting masks. An attenuating phase shifting mask uses an opaque material in the phase shifting mask, such as, molybdenum silicon (MoSi), instead of etched trenches or apertures used in an alternating phase shift mask. The opaque material in an attenuating phase shift mask allows only a small percentage of light to pass through. As a result of the light passing through the opaque material, the phase of the light can be changed by 180 degrees.

Figure 1:
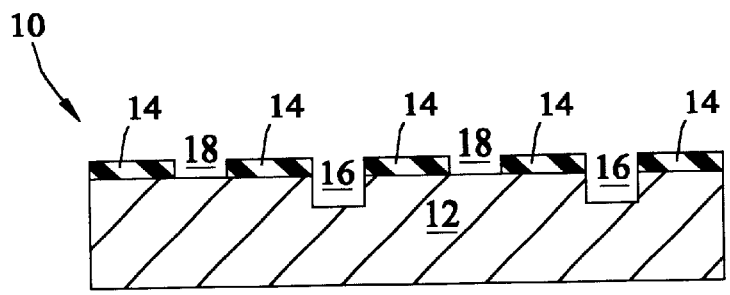
FIG. 1 is an exemplary conventional phase shifting mask.
Figure 2:
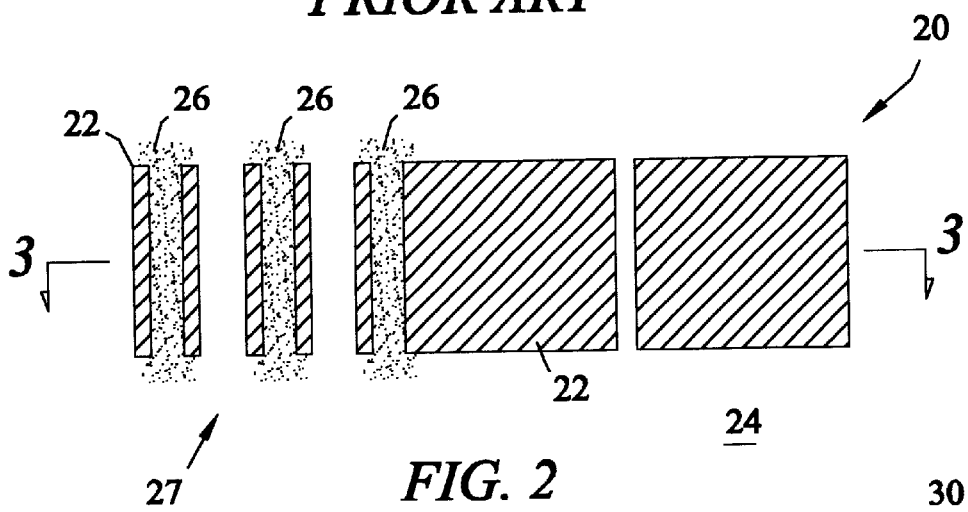
FIG. 2 is a top-down view of a portion of an exemplary layout design of a phase shifting mask in accordance with an exemplary embodiment.

Referring now to FIG. 2, a mask portion 20 can include opaque portions 22, a transparent portion 24, and trenches 26. Opaque portions 22 can be a patterned layer of an opaque material, such as, chrome. Patterns of opaque portions 22 can be configured to form a dense line region 27 and an isolated line region 29. Transparent portion 24 can be a layer of transparent material, such as, quartz which is located beneath opaque portions 22. Trenches 26 are trenches located within transparent portion 24. Trenches 26 are formed by etching transparent portion 24.

In an exemplary embodiment, trenches 26 are configured to have a depth which provides a 180 degree phase shifting effect. Generally, the depth of trenches 26 depends on the wavelength of light being used. As discussed, phase shifting masks can be utilized to improve mask resolution and depth of focus by phase shifting light at certain portions such that the light waves passing through the mask interfere constructively instead of destructively with proximate or adjacent transmitted light.

Figure 3:
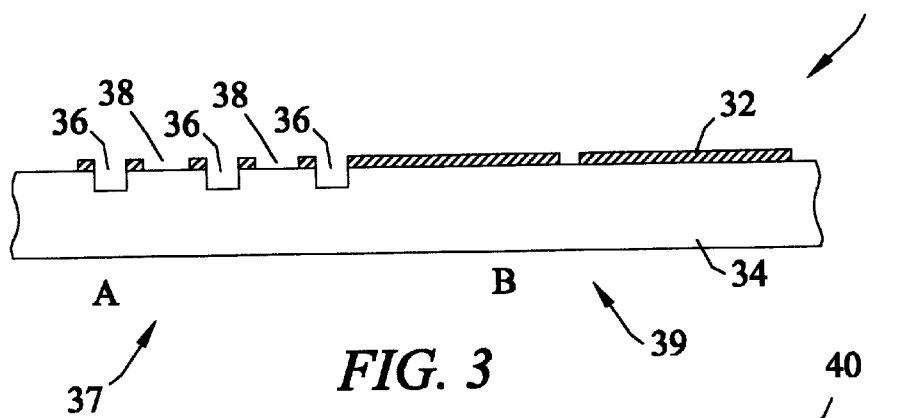
FIG. 3 is a cross-sectional view of the portion of the phase shifting mask of FIG. 2 at line 3—3.

FIG. 3 illustrates a mask portion 30 which includes an opaque layer 32, a transparent layer 34, and trenches 36. Mask portion 30 illustrates mask portion 20 viewed in cross-section about line 3—3. In an exemplary embodiment, opaque layer 32 is chrome (Cr) and transparent layer 34 is quartz (Qz). In operation, mask portion 30 allows light to pass through portions of transparent layer 34 not covered by opaque layer 32. Light passing through transparent layer 34 at trenches 36 is shifted in phase by 180 degrees compared to light passing through transparent layer 34 at portions 38. Advantageously, mask portion 30 can include a dense line region 37 and an isolated line region 39. In an exemplary embodiment, dense line region 37 is an alternating phase shifting mask area and isolated line region 39 is an attenuating phase shifting area.

FIGS. 4–11 describe exemplary steps in a method of forming a mask portion having an alternating phase shifting mask area portion and attenuating phase shifting mask area portion. Advantageously, an alternating phase shifting mask portion can be very effective in improving the depth of focus and resolution limit for dense line areas whereas attenuating phase shifting mask area portions can be very effective in improving the depth of focus and resolution limit for isolated space or contact patterns.

Figure 4:
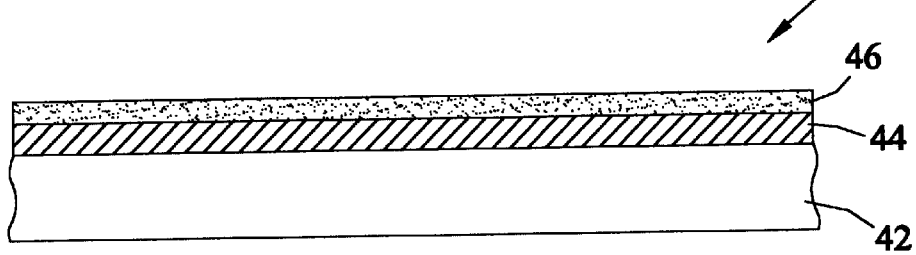
FIG. 4 is a cross-sectional view of a portion of a phase shifting mask showing a deposition step.

Referring to FIG. 4, a mask portion 40 can include a transparent layer 42, a phase shifting mask material layer 44, and an opaque layer 46. In an exemplary embodiment, transparent layer 42 can include a transparent material, such as, quartz and can have a thickness of 0.25 inches. In an exemplary embodiment, phase shifting mask material 44 is deposited over transparent layer 42. Phase shifting mask material layer 44 can include molybdenum silicon (MoSi) and can have a thickness which is approximately equal to:

(wavelength of the lithographic stepper)/2 (n−1), where n is the refraction index of the phase shifting material. In an exemplary embodiment, opaque layer 46 can be chrome and can have a thickness of between 600 and 1000 Angstroms.

Figure 5:
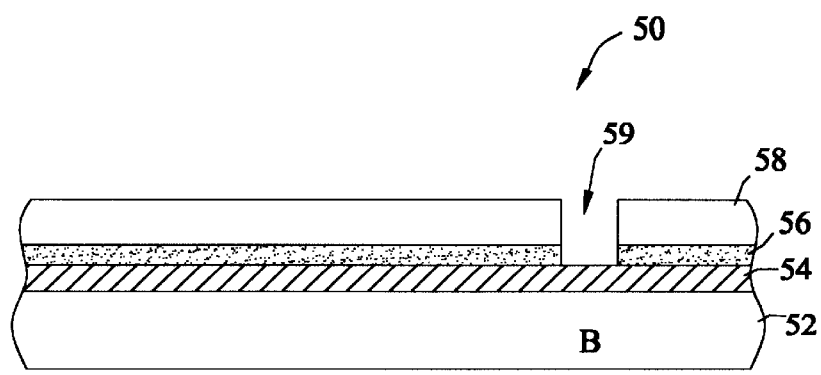
FIG. 5 is a cross-sectional view of a portion of a phase shifting mask showing a step of patterning an opaque layer.

FIG. 5 illustrates a mask portion 50 which can include a transparent layer 52, a phase shifting material layer 54, an opaque layer 56, and a resist layer 58. Mask portion 50 can represent mask portion 40 described with reference to FIG. 4 after a patterning step. In an exemplary embodiment, resist layer 58 can include a photoresist or an e-beam resist material which is coated over opaque layer 56 and patterned to form an aperture 59. A portion of opaque layer 56 is then etched according to aperture 59.

Figure 6:
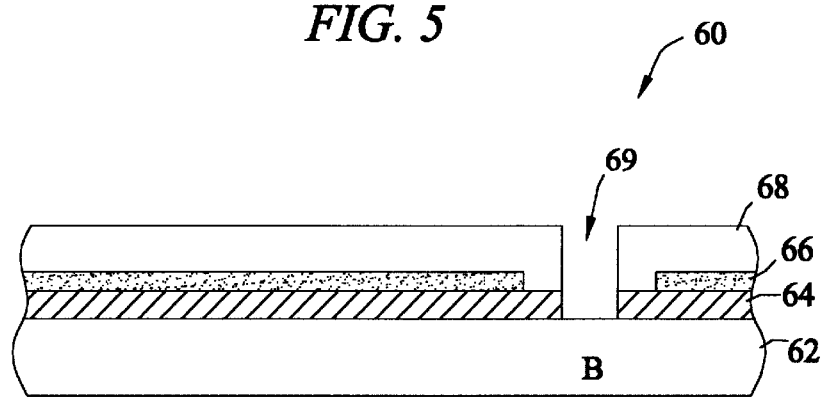
FIG. 6 is a cross-sectional view of a portion of a phase shifting mask showing a step of patterning a phase shifting material layer.

FIG. 6 illustrates a mask portion 60 which can include a transparent layer 62, a phase shifting material layer 64, an opaque layer 66, and a resist layer 68. Mask portion 60 can represent mask portion 50 described with reference to FIG. 5 after a patterning step. In an exemplary embodiment, resist layer 68 is coated or deposited over opaque layer 66 and a portion of phase shifting material layer 64, which is exposed by an aperture in opaque layer 66. Resist layer 68 is patterned to etch an aperture 69 in phase shifting material layer 64. Aperture 69 will be used in an isolated line feature of an attenuating phase shifting area, as described below.

Figure 7:
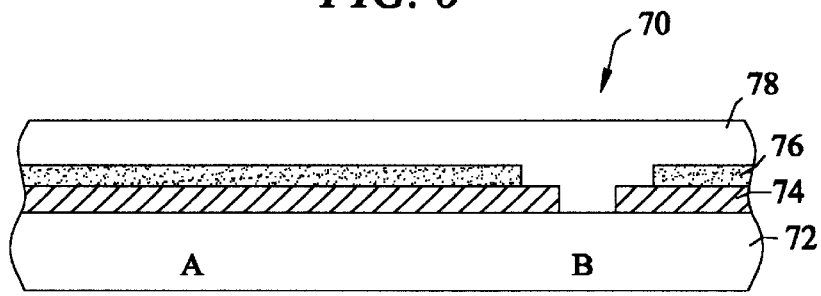
FIG. 7 is a cross-sectional view of a portion of a phase shifting mask showing a deposition step.

FIG. 7 illustrates a mask portion 70 which can include a transparent layer 72, a phase shifting material layer 74, an opaque layer 76, and a resist layer 78. Mask portion 70 can represent mask portion 60 described with reference to FIG. 6 after a deposition step. In an exemplary embodiment, resist layer 78 is deposited over opaque layer 76, exposed portions of phase shifting material layer 74, and exposed portions of transparent layer 72. In an exemplary embodiment, resist layer 78 is used in the patterning of densely spaced features in a portion 77 of mask portion 70. A portion 79 of mask portion 70 can include an isolated feature formed in the patterning steps described with reference to FIGS. 4–6.

Figure 8:
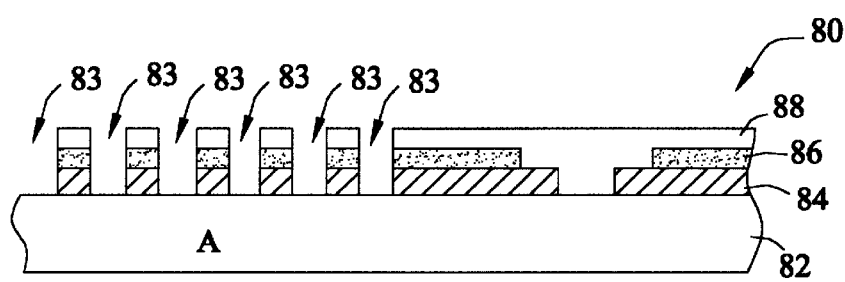
FIG. 8 is a cross-sectional view of a portion of a phase shifting mask showing a step of dense line patterning.

Referring now to FIG. 8, a mask portion 80 can include a transparent layer 82, a phase shifting mask layer 84, an opaque layer 86, and a resist layer 88. Mask portion 80 can represent mask portion 70 described with reference to FIG. 7 after a step of dense line patterning. In an exemplary embodiment, trenches or apertures 83 can be formed in phase shifting material layer 84 and opaque layer 86. Trenches 83 are located in a portion 87 of mask portion 80. Portion 87 corresponds to an alternating phase shifting mask portion of mask portion 80.

Figure 9:
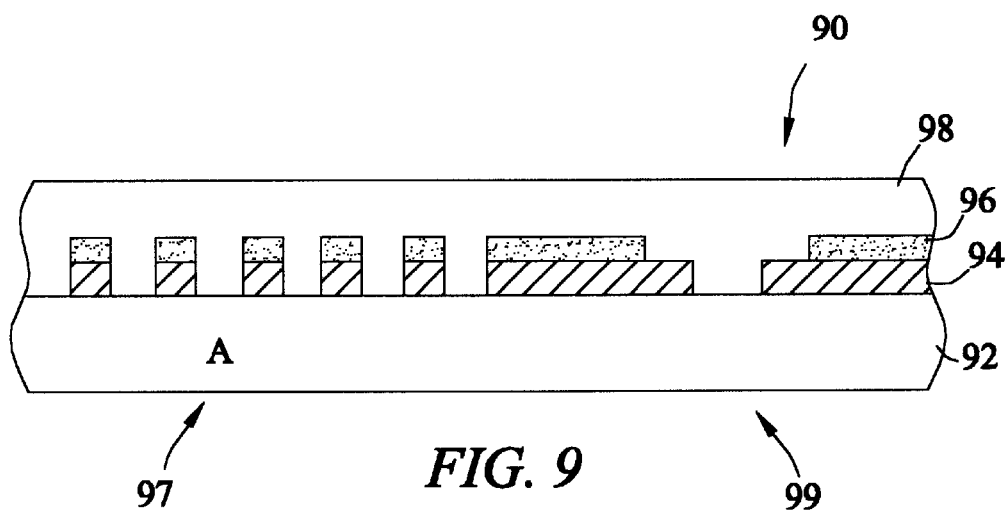
FIG. 9 is a cross-sectional view of a portion of a phase shifting mask showing a resist deposition step.
Figure 10:
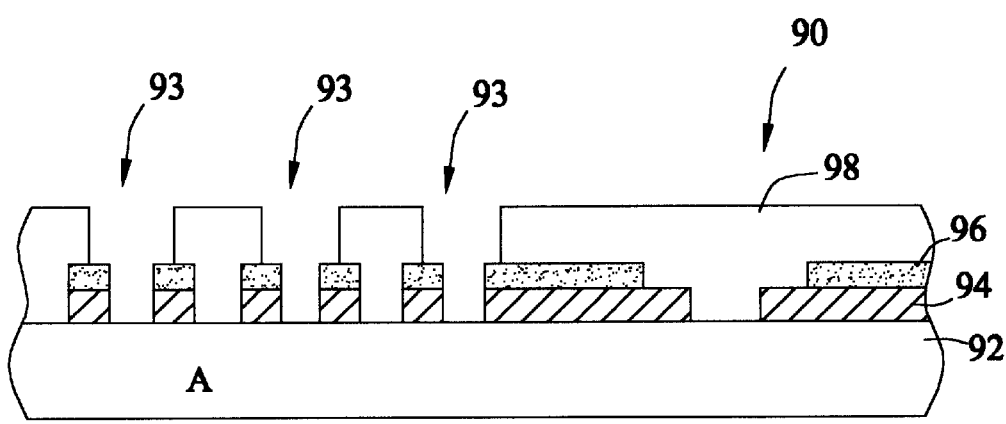
FIG. 10 is a cross-sectional view of a portion of a phase shifting mask showing a patterning step.

Referring now to FIG. 9, a mask portion 90 can include a transparent layer 92, a phase shifting material layer 94, an opaque layer 96, and a resist layer 98. Mask portion 90 can represent mask portion 80 described with reference to FIG. 8 after a resist deposition step. In an exemplary embodiment, resist layer 98 can be coated over mask portion 90 to form trenches in transparent layer 92 to have an alternating phase shifting mask effect. Referring now to FIG. 10, resist layer 98 is patterned in a portion 97 of mask portion 90 to form trenches 93, which are used in the formation of trenches 95 (FIG. 11) in transparent layer 92.

Figure 11:
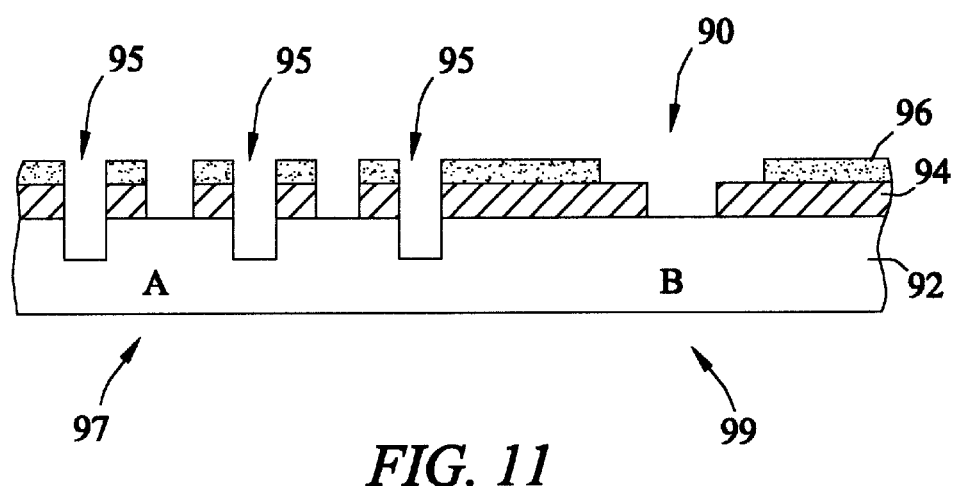
FIG. 11 is a cross-sectional view of a portion of a phase shifting mask showing a trench formation step.

As illustrated in FIG. 11, trenches 95 are etched to a depth that is approximately equal to:

(the wavelength of lithographic stepper)/2 (n−1), where n is the refraction index of the phase shifting material. In an exemplary embodiment, portion 97 of mask portion 90 can include alternating phase shifting mask characteristics and a portion 99 of mask portion 90 can include attenuated phase shifting mask characteristics. In an exemplary embodiment, the transmittance of the attenuated phase shifting mask characteristic of portion 99 can be 5–30 percent.

Advantageously, mask portion 90 can help a lithography engineer decide which kind of phase shifting mask to choose in the integrated circuit (IC) fabrication design process. A lithography engineer can run experiments for different patterns using mask portion 90 and collect engineering data before ordering a mask for fabrication. One advantage of mask portion 90 is that it has both attenuating and alternating phase shifting mask characteristics, allowing engineers to forego the time and expense of running two different tests to get design results.

Alternating portion 97 and attenuating portion 99 of mask portion 90 divide the mask in half. That is, alternating portion 97 comprises one half of mask portion 90 and attenuating portion 99 comprises the other half of mask portion 90. Alternating portion 97 and attenuating portion 99 each provide a large image associated with an image to be projected. The image to be projected can represent an entire integrated circuit wafer or an integrated circuit chip in a direct lithographic tool. As such, mask portion 90 provides both attenuation and alternating phase shifting qualities. Each portion of mask portion 90 provides an identical image to the other portion so that qualities of each portion can be compared with each other. For example, using mask portion 90, a lithography engineer can decide weather an image is best projected using an attenuated phase shifting mask or an alternating phase shifting mask by using mask portion 90 to see the characteristics and attributes of the image. In an alternative embodiment, mask portion 90 is utilized where areas in an integrated circuit design include densely located features and isolated located features. Densely located features would be patterned using portion 97 and isolated located features would be patterned using portion 99.

While the embodiments illustrated in the FIGURES and described above are presently preferred, it should be understood that these embodiments are offered by way of example only. Other embodiments may include, for example, different arrangements of alternating and attenuating portions of photoresist phase shifting masks. The invention is not limited to a particular embodiment, but extends to various modifications, combinations, and permutations that nevertheless fall within the scope and spirit of the appended claims.

What is claimed is:

1. A photoresist mask used in the fabrication of integrated circuits, the photoresist mask comprising:

a first portion, the first portion having a phase shifting material layer and an opaque layer disposed over a transparent layer, the first portion having trenches in the transparent layer selectively located to provide an alternating phase shifting characteristic; and a second portion, the second portion having the opaque layer disposed over the phase shifting material layer which is disposed over the transparent layer, the second portion having trenches in the opaque layer and phase shifting material layer wherein the trenches terminate at the transparent layer, the second portion being configured to provide an attenuating phase shifting characteristic.

2. The photoresist mask of claim 1, wherein the second portion provides attenuating phase shifting characteristics with a transmittance of between 5 and 30%.

3. The photoresist mask of claim 1, wherein the first portion and the second portion are configured to have a substantially similar test pattern, whereby the substantially similar test pattern on the first and second portions is used to determine which of the first portion and the second portion provides better patterning.

4. The photoresist mask of claim 1, wherein the phase shifting material layer includes molybdenum silicon (MoSi).

5. The photoresist mask of claim 1, wherein the phase shifting material layer has a thickness of equal to a wavelength of a lithographic stepper divided by 2 (n−1), where n is the refraction index of the phase shifting material layer.

6. The photoresist mask of claim 1, wherein the first portion comprises densely located lines, the densely located lines being defined by apertures in the opaque layer and phase shifting material layer.

7. The photoresist mask of claim 1, wherein the transparent layer of the first portion is the same layer as the transparent layer of the second portion.

8. The photoresist mask of claim 1, wherein the trenches in the transparent layer have a depth approximately equal to a wavelength of a lithographic stepper divided by 2 (n−1), where n is the refraction index of the phase shifting material layer.

9. A photolithographic mask which selectively alters the phase of light passing through certain areas of the mask to improve feature resolution and depth of focus in the lithographic process, the mask comprising:

a transparent layer;

a first opaque layer disposed over the transparent layer; and a second opaque layer disposed over portions of the first opaque layer, wherein a first portion of the photolithographic mask is defined by an area including apertures in the first and second opaque layers and trenches in the transparent layer beneath every other aperture in the first and second opaque layers, the first portion having an alternating phase shifting characteristic, further wherein a second portion of the photolithographic mask is defined by an area including at least one aperture in the first and second opaque layers wherein the aperture terminates at the transparent layer, the second portion having an attenuating phase shifting characteristic.

10. The mask of claim 9, wherein the first opaque layer has a transmittance of 5–30%.

11. The mask of claim 9, wherein the first portion includes densely patterned lines and the second portion includes an isolated line.

12. The mask of claim 11, wherein the trenches have a depth of:

(wavelength of a lithographic stepper)/2 (n−1), where n is the refraction index of the phase shifting material layer.

13. The mask of claim 9, wherein the first opaque layer comprises a material including moybdenum silicon (MoSi).

14. The mask of claim 9, wherein the first opaque layer has a thickness of:

(wavelength of a lithographic stepper)/2 (n−1), where n is the refraction index of the phase shifting material layer.

15. A test photolithographic mask having both alternating phase shifting and attenuating phase shifting portions, the test photolithographic mask comprising:

a first section of a transparent layer and a first opaque layer, the first section being configured to provide alternating phase shifting properties; and a second section of the transparent layer, the first opaque layer and a second opaque layer, the first opaque layer being disposed over the second opaque layer which is disposed over the second section, the first and second opaque layers having trenches wherein the trenches terminate at the second section, the second section being configured to provide attenuating phase shifting properties.

16. The test photolithographic mask of claim 15, wherein the second opaque layer of the second section is disposed over the transparent layer of the first section.

17. The test photolithographic mask of claim 15, wherein the second opaque layer of the second section has a thickness of:

(wavelength of a lithographic stepper)/2 (n−1), where n is the refraction index of the phase shifting material layer.

18. The test photolithographic mask of claim 15, wherein the first section further comprises trenches selectively located in the transparent layer.

19. The test photolithographic mask of claim 15, wherein the second opaque layer of the second section comprises molybdenum silicon (MoSi).

20. The test photolithographic mask of claim 15, wherein the second section provides attenuating phase shifting characteristics with a transmittance of between 5 and 30%.

\* \* \* \* \*